(12) United States Patent
Li et al.

(10) Patent No.: US 9,548,024 B2
(45) Date of Patent: Jan. 17, 2017

(54) PIXEL DRIVING CIRCUIT, DRIVING METHOD THEREOF AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Tianma Li, Beijing (CN); Fan Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 14/368,408

(22) PCT Filed: Oct. 18, 2013

(86) PCT No.: PCT/CN2013/085516
§ 371 (c)(1),
(2) Date: Jun. 24, 2014

(87) PCT Pub. No.: WO2015/014025
PCT Pub. Date: Feb. 5, 2015

(65) Prior Publication Data
US 2015/0084843 A1    Mar. 26, 2015

(30) Foreign Application Priority Data
Jul. 31, 2013 (CN) .......................... 2013 1 0329899

(51) Int. Cl.
G09G 3/30 (2006.01)
G09G 3/32 (2016.01)
H01L 27/32 (2006.01)

(52) U.S. Cl.
CPC .......... G09G 3/3258 (2013.01); G09G 3/3208 (2013.01); G09G 3/3225 (2013.01);
(Continued)

(58) Field of Classification Search
CPC ................. G09G 2300/0819; G09G 2320/043; G09G 2300/0842; G09G 2320/045; G09G 2320/0233; G09G 3/3208; G09G 3/3225; H01L 27/3262
See application file for complete search history.

(56) References Cited

U.S. PATENT DOCUMENTS

2001/0028060 A1* 10/2001 Yamazaki ............ G09G 3/3233
257/72
2002/0190326 A1* 12/2002 Nagao .................. G09G 3/3648
257/359
(Continued)

FOREIGN PATENT DOCUMENTS

CN    1577453 A    2/2005
CN    102243839 A    11/2011
(Continued)

OTHER PUBLICATIONS

Written Opinion of the International Searching Authority dated Apr. 24, 2014; PCT/CN2013/085516.
(Continued)

*Primary Examiner* — Michael J Eurice
(74) *Attorney, Agent, or Firm* — Ladas & Parry LLP

(57) ABSTRACT

Provided are a pixel driving circuit, a driving method thereof and a display apparatus. The pixel driving circuit includes an electroluminescent element, a driving transistor, a switch
(Continued)

unit, a charging unit, a compensation unit, a cutoff unit and a storage unit. The pixel driving circuit charges the storage capacitor by the charging unit first, and then uses the method of charging first and discharging later to make the voltage in the storage capacitor match the driving current quickly to perform fast compensation of the threshold voltage $V_{th}$, and thus make the driving current provided by the driving transistor not influenced by the threshold voltage $V_{th}$, thereby raising the consistency of the driving currents and improving the uniformity of brightness.

4 Claims, 3 Drawing Sheets

(52) U.S. Cl.
CPC ....... *G09G 3/3233* (2013.01); *H01L 27/3262* (2013.01); *G09G 2300/0819* (2013.01); *G09G 2300/0842* (2013.01); *G09G 2300/0861* (2013.01); *G09G 2310/0262* (2013.01); *G09G 2320/0233* (2013.01); *G09G 2320/043* (2013.01); *G09G 2320/045* (2013.01); *G09G 2330/00* (2013.01)

(56) References Cited

U.S. PATENT DOCUMENTS

| | | | | |
|---|---|---|---|---|
| 2002/0196213 A1* | 12/2002 | Akimoto | ............... | G09G 3/3258 345/82 |
| 2004/0174354 A1* | 9/2004 | Ono | ............... | G09G 3/3233 345/204 |
| 2004/0183583 A1* | 9/2004 | Mizuno | ............... | H03K 17/693 327/389 |
| 2005/0017934 A1* | 1/2005 | Chung | ............... | G09G 3/3233 345/82 |
| 2005/0116656 A1* | 6/2005 | Shin | ............... | G09G 3/3233 315/169.3 |
| 2005/0200300 A1* | 9/2005 | Yumoto | ............... | G09G 3/325 315/169.1 |
| 2005/0269959 A1* | 12/2005 | Uchino | ............... | G09G 3/2011 315/169.3 |
| 2005/0269961 A1* | 12/2005 | Shibusawa | ............... | G09G 3/3233 315/169.3 |
| 2006/0022909 A1* | 2/2006 | Kwak | ............... | G09G 3/3233 345/76 |
| 2006/0022912 A1* | 2/2006 | Park | ............... | G09G 3/3266 345/76 |
| 2006/0077134 A1* | 4/2006 | Hector | ............... | G09G 3/3233 345/76 |
| 2006/0097965 A1* | 5/2006 | Deane | ............... | G09G 3/3233 345/76 |
| 2007/0063993 A1* | 3/2007 | Shishido | ............... | G09G 3/3241 345/175 |
| 2007/0296671 A1* | 12/2007 | Han | ............... | G09G 3/3233 345/92 |
| 2008/0030446 A1* | 2/2008 | Asano | ............... | G09G 3/3233 345/87 |
| 2008/0049053 A1* | 2/2008 | Asano | ............... | G09G 3/3233 345/697 |
| 2008/0122759 A1* | 5/2008 | Levey | ............... | G09G 3/3233 345/78 |
| 2008/0122760 A1* | 5/2008 | Levey | ............... | G09G 3/3233 345/78 |
| 2009/0135111 A1* | 5/2009 | Yamamoto | ............... | G09G 3/3233 345/76 |
| 2009/0273546 A1* | 11/2009 | Kim | ............... | G09G 3/3233 345/76 |
| 2010/0039458 A1* | 2/2010 | Nathan | ............... | G09G 3/3233 345/698 |
| 2010/0207920 A1* | 8/2010 | Chaji | ............... | G09G 3/3233 345/211 |
| 2010/0225630 A1* | 9/2010 | Levey | ............... | G09G 3/3233 345/211 |
| 2012/0013581 A1* | 1/2012 | Nathan | ............... | G09G 3/3233 345/204 |
| 2014/0084806 A1 | 3/2014 | Qi et al. | | |

FOREIGN PATENT DOCUMENTS

| | | |
|---|---|---|
| CN | 102290027 A | 12/2011 |
| CN | 102651197 A | 8/2012 |
| CN | 102654974 A | 9/2012 |
| CN | 203366706 U | 12/2013 |
| JP | 2009-058621 A | 3/2009 |
| KR | 20080042616 A | 5/2008 |

OTHER PUBLICATIONS

First Chinese Office Action dated Dec. 26, 2014; Appln. No. 201310329899.7.

\* cited by examiner

PIXEL DRIVING CIRCUIT, DRIVING METHOD THEREOF AND DISPLAY APPARATUS

TECHNICAL FIELD OF THE DISCLOSURE

The present disclosure relates to the technical field of organic light-emitting display, and particularly to a pixel driving circuit, a driving method thereof and a display apparatus.

BACKGROUND

Compared with traditional liquid crystal panels, the Active Matrix/Organic Light Emitting Diode (AMOLED) display panel has characteristics such as faster response, larger contrast, wider angle of view, and so on, and thus has drawn more and more attention to display technology developers.

The AMOLED display panel can emit light due to being driven by current generated by a driving Thin Film Transistor (TFT) in the saturation state. Different currents would be generated due to different threshold voltages when the same gray-scale voltage is input, which results in nonuniformity of driving current. The Low Temperature Poly-Silicon (LTPS) has very poor uniformity of threshold voltage $V_{th}$ in the manufacturing procedure, and the threshold voltage $V_{th}$ also drifts; therefore, conventional 2T1C circuits have very poor uniformity of brightness.

FIG. 1 illustrates a voltage driven pixel driving circuit structure (2T1C) composed of 2 TFT transistors and 1 capacitors as known. The first transistor M1 transports the voltage on the data line to the gate of the driving transistor DTFT which transforms this data voltage into corresponding current to be supplied to the organic light emitting diode. During normal operation, the driving transistor DTFT should operate at the saturation region to supply stable driving current within the scanning period of one row. The driving current (i.e., the current flowing through the OLED) can be expressed as:

$$I_{OLED} = \frac{1}{2}\mu_n \cdot C_{OX} \cdot \frac{W}{L} \cdot (V_{data} - V_{oled} - V_{th})^2$$

wherein μn is the carrier mobility, $C_{ox}$ is the capacitance of the gate oxide layer, W/L is the aspect ratio of the transistor, $V_{data}$ is the data voltage, $V_{oled}$ is the operating voltage of the OLED which is shared by all pixel units, and $V_{th}$ is the threshold voltage of the driving transistor DTFT. As can be seen from the above expression, if $V_{th}$ is different between different pixel units, it results in that the driving current would be different; if the threshold voltage $V_{th}$ of the driving transistor drifts with time, it may results that current at former time would be different from that at latter time, which causes afterimage, reduces display effect, and influences users' experience.

SUMMARY

A technical problem to be solved by the present disclosure is to provide a pixel driving circuit and a driving method thereof in view of the drawbacks of the prior art, in which the driving current provided by the driving transistor would not be influenced by the threshold voltage $V_{th}$ of the driving transistor by compensating the threshold voltage $V_{th}$ in order to improve the consistency of the driving current and the uniformity of the brightness.

A solution according to an aspect of the present disclosure is a pixel driving circuit comprising an electroluminescent element, a driving transistor, a switch unit, a charging unit, a compensation unit, a cutoff unit and a storage unit, wherein
  the switch unit is configured to control data voltage writing of a data line, a first terminal of the switch unit is connected to the data line, and a second terminal of the switch unit is connected to a first terminal of the charging unit, a first terminal of the compensation unit, a first terminal of the storage unit and the gate of the driving transistor respectively;
  the charging unit is configured to control a driving power source to charge the storage unit, and a second terminal of the charging unit is connected to the driving power source and a first terminal of the electroluminescent element respectively;
  the cutoff unit is configured to cut off electric connection between the electroluminescent element and the source of the driving transistor, a first terminal of the cutoff unit is connected to a second terminal of the electroluminescent element, and a second terminal of the cutoff unit is connected to the source of the driving transistor;
  the compensation unit is configured to pre-store a threshold voltage of the driving transistor into the storage unit, and a second terminal of the compensation unit is connected to the source of the driving transistor; and
  the drain of the driving transistor and a second terminal of the storage unit are grounded.

As an example, the electroluminescent element is an organic light emitting diode (OLED), the storage unit is a storage capacitor, the switch unit is a first transistor, the charging unit is a third transistor, the compensation unit is a second transistor, and the cutoff unit is a fourth transistor;
  the gate of the first transistor is connected to a first scan line, the source of the first transistor is connected to the data line, and the drain of the first transistor is connected to the first terminal of the storage capacitor, the source of the second transistor, the drain of the third transistor and the gate of the driving transistor respectively;
  the gate of the third transistor is connected to a second scan line, and the source of the third transistor is connected to the driving power source and the first terminal of the OLED respectively;
  the gate of the fourth transistor is connected to a control signal line, the source of the fourth transistor is connected to the second terminal of the OLED, and the drain of the fourth transistor is connected to the source of the driving transistor and the drain of the second transistor respectively; and
  the gate of the second transistor is connected to the first scan line.

As an example, all the transistors have a same channel type.

As an example, all the transistors are N channel thin film transistors (TFTs); the first terminal of the OLED is the anode of the OLED, the anode of the OLED is connected to the high level output terminal of the driving power source, and the second terminal of the OLED is the cathode of the OLED. As an example, all the transistors are P channel thin film transistors (TFTs); the first terminal of the OLED is the cathode of the OLED, the cathode of the OLED is connected to the low level output terminal of the driving power source, and the second terminal of the OLED is the anode of the OLED.

The present disclosure also provides a driving method for driving any pixel driving circuit as described in the above, comprising the following steps of:

applying a control signal at a second scan line to control a third transistor to be turned on, applying a control signal at a first scan line and a control signal line to control a first transistor, a second transistor and a fourth transistor to be turned off, and a driving power source charging a storage capacitor;

applying a control signal at the first scan line to control the first transistor and the second transistor to be turned on, applying a control signal at the second scan line to control the third transistor to be turned off, and writing a threshold voltage of a driving transistor and a data voltage at a data line into the storage capacitor; and applying a control signal at a control signal line to turn on the fourth transistor, applying a control signal at the first scan line to control the first transistor and the second transistor to be turned off, and driving the OLED to emit light by voltage stored in the storage capacitor.

The present disclosure also provides a display apparatus comprising any pixel driving circuit as described in the above.

The pixel driving circuit provided in an embodiment of the present disclosure charges the storage capacitor by the charging unit first, and then uses the method of charging first and discharging later to make the voltage in the storage capacitor match the driving current quickly to perform fast compensation of the threshold voltage $V_{th}$, and thus make the driving current provided by the driving transistor not influenced by the threshold voltage $V_{th}$, thereby raising the consistency of the driving currents, improving the uniformity of brightness and enhancing users' experience.

DETAILED DESCRIPTION

In the following, specific implementations of the present disclosure will be described further in connection with drawings and embodiments. The following embodiments are only for illustrating the present disclosure, but not for limiting the scope of the present disclosure.

First Embodiment

Figure 1:
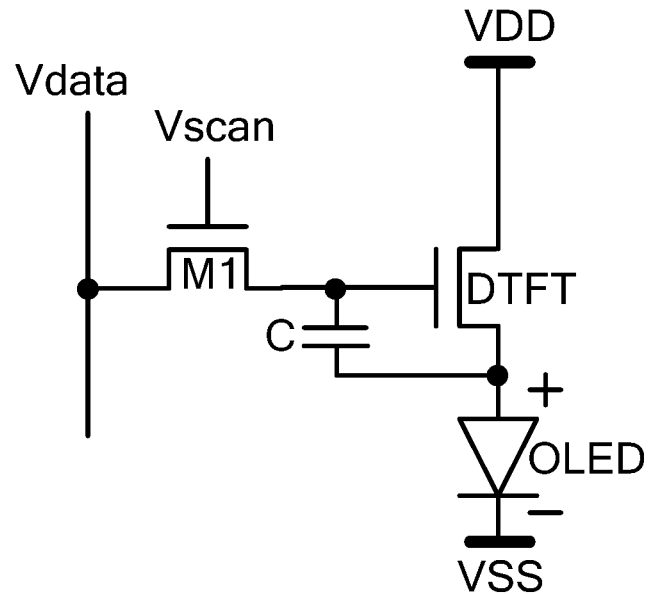
FIG. 1 is a schematic structural diagram of the known 2T1C pixel driving circuit.
Figure 2:
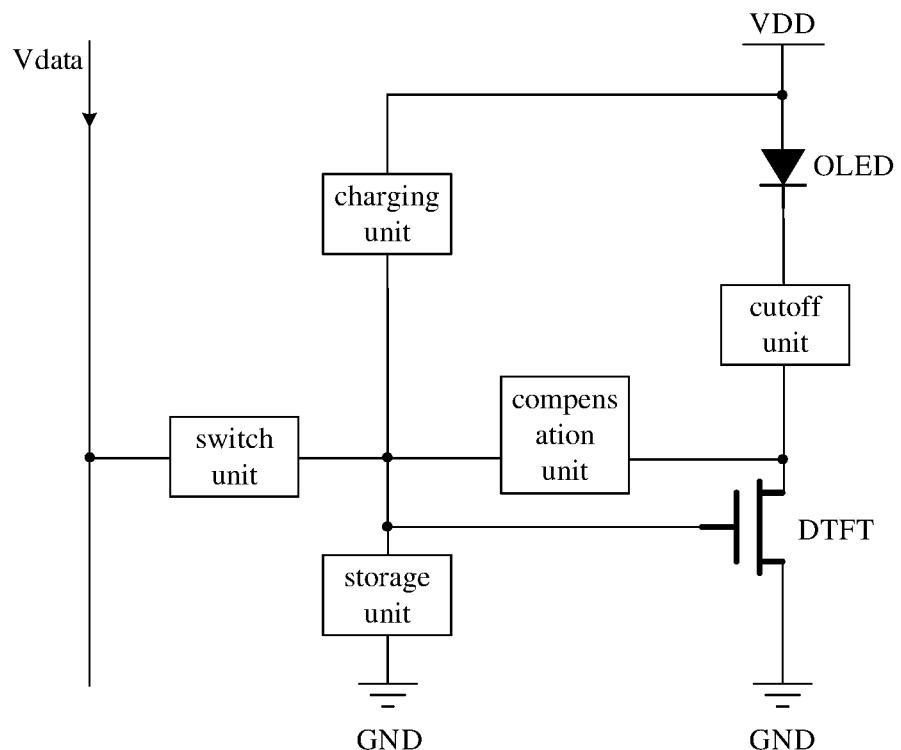
FIG. 2 is a schematic structural diagram of a pixel driving circuit in a first embodiment of the present disclosure.

As shown in FIG. 2, a pixel driving circuit provided in an embodiment of the present disclosure mainly comprises an electroluminescent element (e.g. OLED shown in the figure), a driving transistor DTFT, a switch unit, a charging unit, a compensation unit, a cutoff unit and a storage unit. The switch unit is configured to control data voltage writing of a data line, a first terminal of the switch unit is connected to the data line, and a second terminal of the switch unit is connected to a first terminal of the charging unit, a first terminal of the compensation unit, a first terminal of the storage unit and the gate of the driving transistor DTFT respectively. The charging unit is configured to control a driving power source to charge the storage unit, and a second terminal of the charging unit is connected to the driving power source and a first terminal of the electroluminescent element respectively. The cutoff unit is configured to cut off electric connection between the electroluminescent element and the source of the driving transistor DTFT, a first terminal of the cutoff unit is connected to a second terminal of the electroluminescent element, and a second terminal of the cutoff unit is connected to the source of the driving transistor DTFT. The compensation unit is configured to pre-store a threshold voltage of the driving transistor DTFT into the storage unit, and a second terminal of the compensation unit is connected to the source of the driving transistor DTFT. The drain of the driving transistor DTFT and a second terminal of the storage unit are grounded. The storage unit is charged by the charging unit first, and then a method of charging first and discharging later is used to make the voltage in the storage unit match the driving current quickly to perform fast compensation of the threshold voltage $V_{th}$, and thus makes the driving current provided by the driving transistor DTFT not influenced by the threshold voltage $V_{th}$, thereby raising the consistency of the driving currents, improving the uniformity of brightness and enhancing users' experience.

Figure 3:
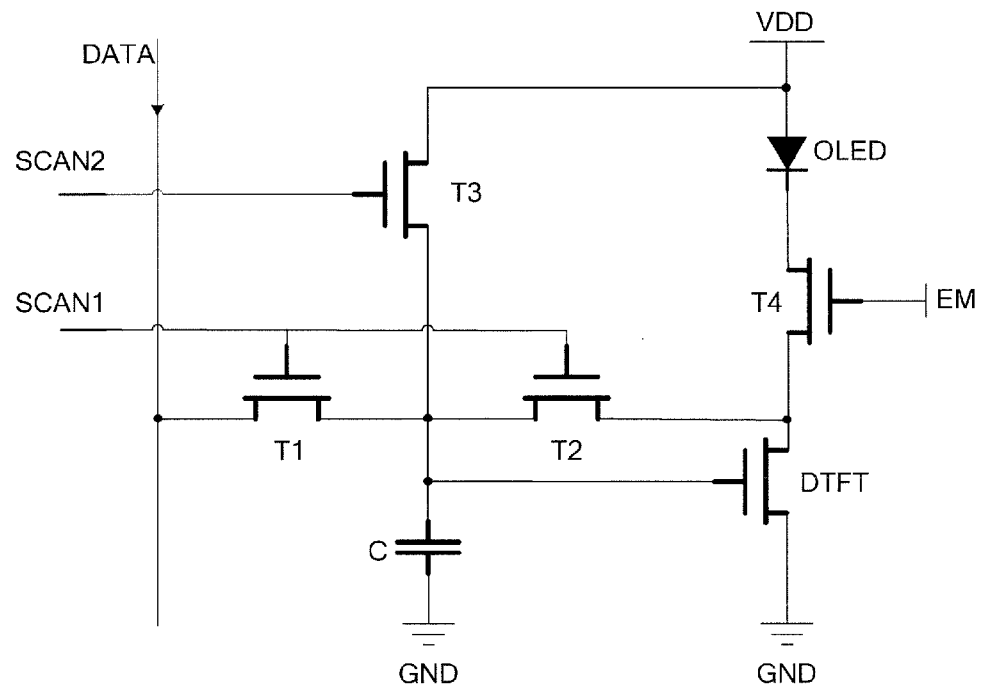
FIG. 3 is a schematic diagram of a specific implementation of the pixel driving circuit in FIG. 2.

As shown in FIG. 3, the present embodiment provides an implementation of the above pixel driving circuit, comprising the driving transistor DTFT and the storage capacitor C. The electroluminescent element is an organic light emitting diode (OLED), the switch unit is a first transistor T1, the charging unit is a third transistor T3, the compensation unit is a second transistor T2, and the cutoff unit is a fourth transistor T4. The implementation also comprises a driving power source and a grounded terminal. A first scan line SCAN1 provides a control signal VSCAN1 to turn on or off the first transistor T1 and the second transistor T2. A second scan line SCAN2 provides a control signal VSCAN2 to turn on or off the third transistor T3. A control signal line EM provides a control signal VEM to turn on or off the fourth transistor T4. A data line DATA writes a data voltage signal Vdata into a pixel through the first transistor T1. The driving power source can output a high voltage VDD or a low voltage VSS.

In the present embodiment, the gate of the first transistor T1 is connected to the first scan line SCAN1, the source of the first transistor T1 is connected to the data line DATA, and the drain of the first transistor T1 is connected to the first terminal of the storage capacitor C, the source of the second transistor T2, the drain of the third transistor T3 and the gate of the driving transistor DTFT respectively. Under the control of the control signal provided by the first scan line SCAN1, the first transistor T1 provides the data voltage signal Vdata of the data line DATA to the storage capacitor C and the voltage is maintained by the storage capacitor C. The gate of the third transistor T3 is connected to the second scan line SCAN2, and the source of the third transistor T3 is connected to the driving power source and the first terminal of the OLED respectively. The driving power source charges the storage capacitor C through the third transistor T3. The gate of the fourth transistor T4 is connected to a control signal line EM, the source of the fourth transistor T4 is connected to the second terminal of the OLED, and the drain of the fourth transistor T4 is connected to the source of the driving transistor DTFT and the drain of the second transistor T2 respectively. The gate of the second transistor T2 is connected to the first scan line. The drain of the driving transistor DTFT and a second terminal of the storage capacitor C are grounded. Under the control of the control signal provided by the first scan line, the second transistor T2 is turned on, and the gate and the source of the driving transistor DTFT are connected to form a diode connection to ensure the driving transistor DTFT operates at the saturation current region, causing the storage capacitor C to discharge until the voltages into the gate and the source of the driving transistor DTFT are both the data voltage at the data line. At this point, the voltage of the storage capacitor C is $$V_c = \sqrt{\frac{2V_{data}}{K}} + V_{th},$$

where K is a constant related to the process and driving design, $V_{data}$ is a voltage inputted by the data line. It can be seen that the threshold voltage of the driving transistor DTFT has been pre-stored into the storage capacitor C, achieving the purpose of compensating the threshold voltage. Other advantages of the pixel driving circuit of the present embodiment are that transistors of the same channel type are used (i.e. all transistors are N channel transistors) to reduce the complexity and fabrication cost of the manufacturing process, and the top light-emitting manner of OLED has higher pixel aperture ratio than the bottom light-emitting manner. However, it can be easily obtained by those skilled in the art that the pixel driving circuit provided in the embodiment of the present disclosure can be easily changed to a pixel driving circuit with only P channel transistors, which differs from the N channel thin film transistor (TFT) circuit in term of connection structures mainly in that when the transistors are all N channel TFTs, the first terminal of the OLED is the anode of the OLED, the anode of the OLED is connected to the high level output terminal of the driving power source, the second terminal of the OLED is the cathode of the OLED, and the cathode of the OLED is connected to the source of the fourth transistor T4; when the transistors are all P channel TFTs, the first terminal of the OLED is the cathode of the OLED, the cathode of the OLED is connected to the low level output terminal of the driving power source, the second terminal of the OLED is the anode of the OLED, and the anode of the OLED is connected to the source of the fourth transistor T4. Of course, the pixel driving circuit provided by an embodiment of the present disclosure can be easily changed to a CMOS (Complementary Metal Oxide Semiconductor) circuit or the like; it is not limited to the pixel driving circuit provided in the present embodiment, and will not be described herein to avoid redundancy.

Figure 4:
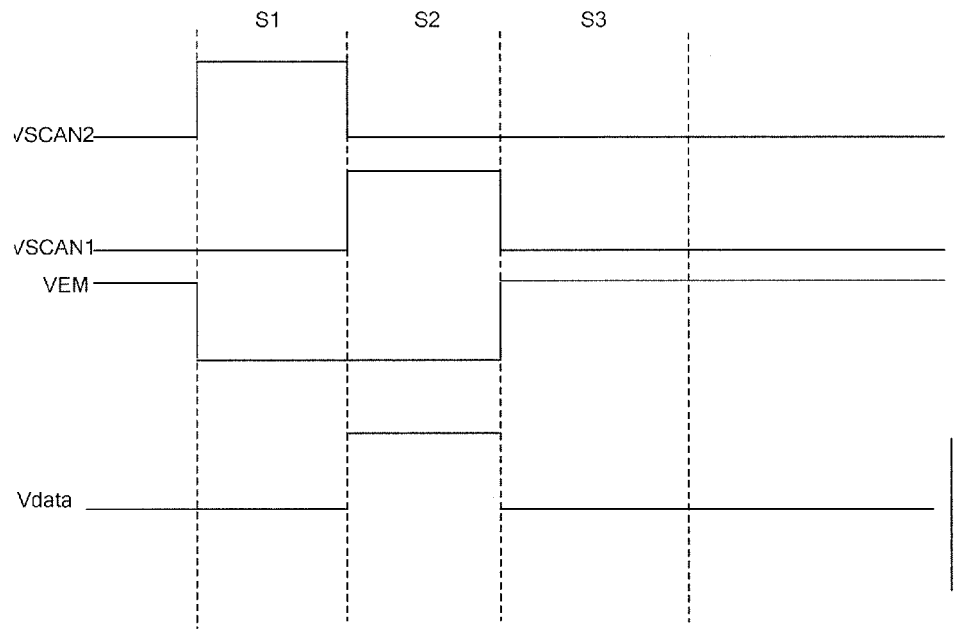
FIG. 4 is a driving sequence diagram of the pixel driving circuit in FIG. 3.

An embodiment of the present disclosure also provides a driving method for driving the above mentioned pixel circuit, mainly comprising a pre-charging time sequence period S1, a compensation time sequence period S2 and a driving-display time sequence period S3. In the following, description is made by taking a driving method applied to the pixel driving circuit shown in FIG. 3 as an example. All the transistors are N channel TFTs, and the schematic driving time sequence diagram is as shown in FIG. 4. The time sequence diagram schematically shows the changes of the control signal VSCAN1 of the first scan line SCAN1, the control signal VSCAN2 of the second scan line SCAN2, the data voltage Vdata of the data line DATA, and the control signal VEM of the control signal line EM in an operation time sequence of one frame. In the following, the operation procedures of the driving method of the pixel driving circuit according to an embodiment of the present disclosure in respective time sequence periods will be described in detail in connection with FIGS. 5-7 respectively.

Pre-Charging Time Sequence Period S1

Figure 5:
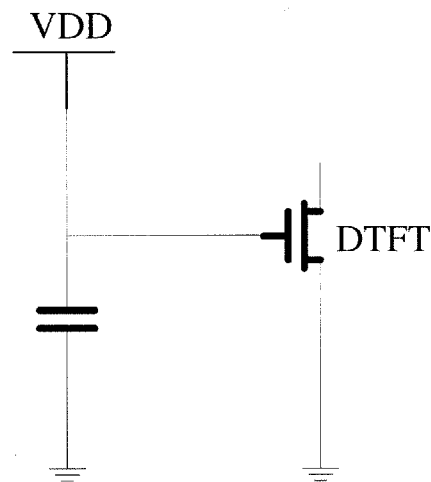
FIG. 5 is a schematic structural diagram of the equivalent circuit of the pixel driving circuit in FIG. 3 at stage S1.

The equivalent circuit diagram in this time sequence period is as shown in FIG. 5. In this time sequence period, a control signal of high level is applied at the second scan line to turn on the third transistor T3, a control signal of low level is applied at the first scan line and the control signal line to turn off the first transistor T1, the second transistor T2 and the fourth transistor T4, and the driving power source charges the storage capacitor C.

Compensation Time Sequence Period S2

Figure 6:
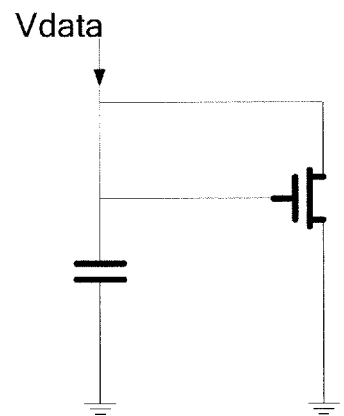
FIG. 6 is a schematic structural diagram of the equivalent circuit of the pixel driving circuit in FIG. 3 at stage S2.

The equivalent circuit diagram in this time sequence period is as shown in FIG. 6. In this time sequence period, a control signal of high level is applied at the first scan line to turn on the first transistor T1 and the second transistor T2. A control signal of low level is applied at the second scan line to turn off the third transistor T3 so as to make the gate and source of the driving transistor DTFT connected and make the driving transistor enter the saturation state, causing the storage capacitor C to discharge until both the gate voltage and the source voltage flowing into the driving transistor DTFT are the data voltage of the data line. At this point, the voltage of the storage capacitor C is $$V_c = \sqrt{\frac{2V_{data}}{K}} + V_{th}$$

where K is a constant related to the process and driving design. The threshold voltage of the driving transistor DTFT and the data voltage at the data line are written into the storage capacitor C.

Driving-Display Time Sequence Period S3

Figure 7:
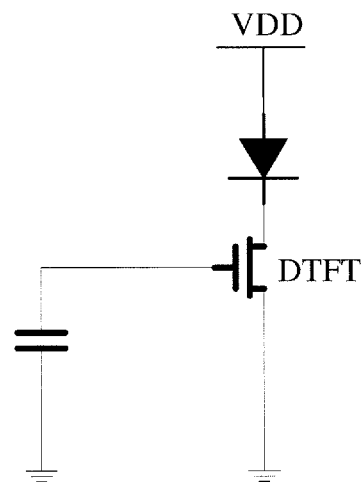
FIG. 7 is a schematic structural diagram of the equivalent circuit of the pixel driving circuit in FIG. 3 at stage S3.

The equivalent circuit diagram in this time sequence period is as shown in FIG. 7. In this time sequence period, a control signal of high level is applied at the control signal line to turn on the fourth transistor T4, and a control signal of low level is applied at the first scan line to turn off the first transistor T1 and the second transistor T2. Since the voltage VDD of the driving power source is larger than Vgs=VG−Vth, where Vgs is the gate-source voltage of the driving transistor DTFT, and VG is the gate potential of the driving transistor DTFT, the driving transistor DTFT enters the saturation state. At this point, the current flowing through the driving transistor DTFT and the OLED is $$I_{oled} = \frac{1}{2}K(V_{gs} - V_{th})^2 = \frac{1}{2}K(V_c - V_{th})^2 = \frac{1}{2}K\left(\sqrt{\frac{2V_{data}}{K}} + V_{th} - V_{th}\right)^2 = V_{data}.$$

It can be seen that the driving current $I_{oled}$ is not related to the threshold voltage of the driving transistor DTFT. Therefore, the drift of the threshold voltage of the driving transistor DTFT would not influence the drain current, i.e.

the driving current $I_{oled}$ of the pixel circuit, such that the OLED displays stably, improving the uniformity of the display brightness and improving the display quality dramatically.

Second Embodiment

The embodiment provides a display apparatus comprising the above pixel circuit. In particular, the display apparatus comprises multiple pixel unit arrays. Each pixel unit is corresponding to any pixel circuit in the above embodiments. Since the pixel circuit compensates the threshold voltage drift of the driving transistor, the OLED displays stably, improving the uniformity of the display brightness and improving the display quality dramatically.

The above implementations are only for illustrating the present disclosure and in no way limit the scope of the present disclosure. It will be obvious that those skilled in the art may make various modifications and variations without departing from the spirit and scope of the present disclosure. Such equivalent technical solutions also fall within the scope of the present disclosure.

What is claimed is:

1. A pixel driving circuit comprising an electroluminescent element, a driving transistor, a switch unit, a charging unit, a compensation unit, a cutoff unit and a storage unit, wherein
   the switch unit is configured to control data voltage writing of a data line, a first terminal of the switch unit is connected to the data line, and a second terminal of the switch unit is connected to a first terminal of the charging unit, a first terminal of the compensation unit, a first terminal of the storage unit and the gate of the driving transistor respectively;
   the charging unit is configured to control a driving power source to charge the storage unit, and a second terminal of the charging unit is connected to the driving power source and a first terminal of the electroluminescent element respectively;
   the cutoff unit is configured to cut off electric connection between the electroluminescent element and the source of the driving transistor, a first terminal of the cutoff unit is connected to a second terminal of the electroluminescent element, and a second terminal of the cutoff unit is connected to the source of the driving transistor;
   the compensation unit is configured to pre-store a threshold voltage of the driving transistor into the storage unit, and a second terminal of the compensation unit is connected to the source of the driving transistor;
   the drain of the driving transistor and a second terminal of the storage unit are connected to each other and are grounded,
   wherein the electroluminescent element is an organic light emitting diode (OLED), the storage unit is a storage capacitor, the switch unit is a first transistor, the charging unit is a third transistor,
   the compensation unit is a second transistor, and the cutoff unit is a fourth transistor;
   the gate of the first transistor is connected to a first scan line, the source of the first transistor is connected to the data line, and the drain of the first transistor is connected to the first terminal of the storage capacitor, the source of the second transistor, the drain of the third transistor and the gate of the driving transistor respectively;
   the gate of the third transistor is connected to a second scan line, and the source of the third transistor is connected to the driving power source and the first terminal of the OLED respectively;
   the gate of the fourth transistor is connected to a control signal line, the source of the fourth transistor is connected to the second terminal of the OLED, and the drain of the fourth transistor is connected to the source of the driving transistor and the drain of the second transistor respectively; and
   the gate of the second transistor is connected to the first scan line.

2. The pixel driving circuit according to claim 1, wherein all the transistors have a same channel type.

3. The pixel driving circuit according to claim 2, wherein all the transistors are N channel thin film transistors (TFTs); the first terminal of the OLED is the anode of the OLED, the anode of the OLED is connected to the high level output terminal of the driving power source, and the second terminal of the OLED is the cathode of the OLED.

4. The pixel driving circuit according to claim 2, wherein all the transistors are P channel thin film transistors (TFTs);
   the first terminal of the OLED is the cathode of the OLED, the cathode of the OLED is connected to the low level output terminal of the driving power source, and
   the second terminal of the OLED is the anode of the OLED.

* * * * *